(12) United States Patent
Nishimura et al.

(10) Patent No.: US 7,943,848 B2
(45) Date of Patent: *May 17, 2011

(54) PHOTOELECTRIC CONVERSION ELEMENT, METHOD OF MANUFACTURING THE SAME AND SOLAR CELL

(75) Inventors: Kazukuni Nishimura, Tokyo (JP); Akihiko Itami, Tokyo (JP); Fumitaka Mochizuki, Tokyo (JP)

(73) Assignee: Konica Minolta Business Technologies, Inc., Tokyo (JP)

( * ) Notice: Subject to any disclaimer, the term of this patent is extended or adjusted under 35 U.S.C. 154(b) by 337 days.

This patent is subject to a terminal disclaimer.

(21) Appl. No.: 11/867,464

(22) Filed: Oct. 4, 2007

(65) Prior Publication Data

US 2008/0115826 A1    May 22, 2008

(30) Foreign Application Priority Data

Nov. 20, 2006  (JP) .................. 2006-312615

(51) Int. Cl.
*H01L 31/00* (2006.01)
*H01L 21/00* (2006.01)
(52) U.S. Cl. ................. 136/263; 136/252; 438/57
(58) Field of Classification Search .......... 136/252, 136/263; 438/57
See application file for complete search history.

(56) References Cited

U.S. PATENT DOCUMENTS
2004/0232506 A1 * 11/2004 Kojima et al. ............ 257/431

FOREIGN PATENT DOCUMENTS

| JP | 2005203112 | * | 7/2005 |
| JP | 2006310097 | * | 11/2006 |
| JP | 2007013115 | * | 1/2007 |
| JP | 2007084684 | * | 4/2007 |

OTHER PUBLICATIONS

Machine tranlsation of JP2005203112, pub. Jul. 2005.*
Machine translation of JP2007013115, pub. Jan. 2007.*
Machine translation of JP2006310097, pub. Nov. 2006.*
Machine translation of JP2007084684, pub. Apr. 2007.*
Sayama et al. "Photosensitization of a porous TiO2 electrode with merocyanine dyes containing a carboxyl group and a long alkyl chain" Chem. Comm. p. 1173-1174, 2000.*
Hara et al. "Molecular Design of Coumarin Dyes for Efficient Dye-Sensitized Solar Cells" J. Phys. Chem. B, 107, p. 597-606, 2003.*

* cited by examiner

*Primary Examiner* — Jeffrey T Barton
*Assistant Examiner* — Allison Bourke
(74) *Attorney, Agent, or Firm* — Lucas & Mercanti, LLP

(57) ABSTRACT

A photoelectric conversion element comprising an electrically conductive support having thereon an oxide semiconductor electrode comprising an oxide semiconductor which is adsorbed with a dye, and a counter electrode facing the oxide semiconductor electrode through a charge transfer layer, wherein the dye is represented by Formula (1):

Formula (1)

$$\left( R_3 - \overset{R_4}{\underset{n4}{=}} - \underset{(R_5)_{n5}}{\bigcirc} - N \underset{n3}{\overset{(R_1)_{n1}}{\underset{(R_2-A)_{n2}}{<}}} \right).$$

9 Claims, No Drawings

PHOTOELECTRIC CONVERSION ELEMENT, METHOD OF MANUFACTURING THE SAME AND SOLAR CELL

FIELD OF THE INVENTION

The present invention relates to a dye sensitized photoelectric conversion element, a method of manufacturing the same and a solar cell utilizing the photoelectric conversion element.

BACKGROUND OF THE INVENTION

In recent years, extensive studies have been made to utilize the sunlight which is limited and generates no toxic substances. Examples of the practical application of sunlight which is a clean energy source, at present, include inorganic solar cells for a residential application such as single crystalline silicon, polycrystalline silicon, amorphous silicon, cadmium telluride and indium-copper selenide.

However, one of the disadvantages of these inorganic solar cells is that, for example, in the case of a silicon solar cell, very high purity silicon is required, in which, naturally, the purification process is complicated and numerous processes are included, resulting in a high manufacturing cost.

On the other hand, many solar cells utilizing an organic material have also been proposed. Examples of an organic solar cell include: (i) a Schottky-type photoelectric conversion element in which a p-type organic semiconductor and a metal having a small work function are connected; and (ii) a hetero-connection type photoelectric conversion element, in which a p-type organic semiconductor and an n-type inorganic semiconductor are connected or a p-type organic semiconductor and an electron accepting organic compound are connected. Organic semiconductors utilized in such an organic solar cell include, for example, a synthetic dye or a pigment such as chlorophyll and perylene; and a conductive polymer material such as polyacetylene, and complex materials thereof. These materials are made into thin film, by such as a vacuum evaporation method, a casting method or a dipping method, which constitutes a battery material. The organic material has advantages, for example, a low cost and easy application to a larger area; however, there are also problems, for example, conversion efficiency as low as not more than 1% in many materials; and poor durability.

In such a situation, a solar cell exhibiting excellent characteristics has been reported by Dr. Gratzel et al., Switzerland (for example, refer to Non-Patent Document 1). The proposed cell is a dye sensitized solar cell, and is a wet type solar cell utilizing titanium oxide porous thin film, which is spectrally sensitized by a ruthenium complex, as a working electrode. Advantages of this method are that (i) a low priced oxide semiconductor such as titanium oxide can be used and the purification up to a high purity of this material is not required, resulting in attaining a low cost; and that (ii) usable light covers a broad visible light region, which enables efficient conversion of sunlight to electricity, since sunlight is rich in a visible light component.

On the contrary, since a ruthenium complex having a resource limitation is utilized, supply of a ruthenium complex is uncertain when this solar cell is utilized in practice. Further, this ruthenium complex is expensive and has a problem of stability in aging, however, this problem will be overcome if the material can be changed into a low priced and stable organic dye.

It has been disclosed that an element having high photoelectric conversion efficiency can be obtained when a compound having a triphenylamine structure is utilized (for example, refer to Patent Document 1). However, these dyes have a problem of durability, which is remained as a problem to be solved.

Patent Document 1 Japanese Patent Application Publication Open to Public Inspection No. 2005-123033 (hereinafter, referred to as JP-A No.)

Non-Patent Document 1 B. O'Regan, M. Gratzel, Nature, 353, 737

SUMMARY OF THE INVENTION

An object of the present invention is to provide a dye sensitized photoelectric conversion element exhibiting high photoelectric conversion efficiency and high durability, a method of manufacturing the same and a solar cell using said photoelectric conversion element.

One of the aspects to achieve the above object of the present invention is a photoelectric conversion element comprising an electrically conductive support having thereon an oxide semiconductor electrode comprising an oxide semiconductor which is adsorbed with a dye, and a counter electrode facing the oxide semiconductor electrode through a charge transfer layer, wherein the dye is represented by Formula (1):

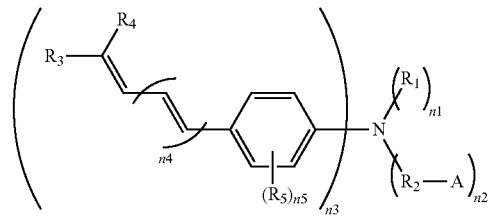

Formula (1)

wherein $R_1$ represents an alkyl group, an aralkyl group, an alkenyl group, an aryl group or an aromatic heterocyclic group; $R_2$ represents a divalent group containing an aromatic hydrocarbon ring, a divalent group containing an aromatic heterocycle or a divalent group containing an aromatic hydrocarbon ring and an aromatic heterocycle; $R_3$ represents a hydrogen atom, an alkyl group, an aralkyl group, an alkenyl group, an aryl group or an aromatic heterocyclic group; $R_4$ represents an aryl group; $R_5$ represents a substituent; n1 is 0 or 1; n2 and n3 each are 1 or 2; n1+n2+n3=3; n4 is an integer of not less than 0; n5 is an integer of 0-4; and A represents a chain structure containing an electron withdrawing group and an acid group, provided that $R_2$ is π-conjugated with the acid group, or A represents a group represented by $A_2$, $A_2$:

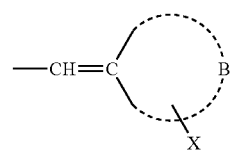

wherein B represents a group of atoms necessary to form a single ring which may have a substituent, provided that the single ring is not condensed with another ring nor substituted with another ring; and X represents a group containing an acid group.

DESCRIPTION OF THE PREFERRED EMBODIMENTS

According to the present invention, a dye sensitized photoelectric conversion element having high photoelectric conversion efficiency and high durability, and a solar cell using said photoelectric conversion element can be provided.

In the following, the present invention will be detailed.

Since the sensitizing dye generates current by repeating a photo-oxidation reaction at the time of power generation, it has been assumed in the present invention that a dye having a strong resistance to oxidation is suitable for improving the durability of the photoelectric conversion element. Therefore, among the compounds provided with a triphenylamine structure, selected has been a structure, in which styryltriphenylamine exhibiting high durability against ozone which is a strong oxidizing agent is employed as a central moiety of a sensitizing dye and a chelate bonding with titanium oxide is made possible by addition of an acid group which enables efficient transfer of an photo-excited electron to titanium oxide. Further, to increase transfer efficiency of a photo-excited electron, a styryltriphenylamine central moiety and an acid group are connected by an electron withdrawing π conjugated system. Thus, a new sensitizing dye exhibiting a high photoelectric conversion efficiency and high durability has been found, when used in a dye sensitized photoelectric conversion element.

<Oxide Semiconductor>

Examples of an oxide semiconductor utilized for the oxide semiconductor electrode of the present invention include: elemental substances such as silicon and germanium; compounds containing an element of Groups 3-5 and Groups 13-15 of the periodic table (also referred to as the element periodic table); sulfides, selenides and nitrides of the abovementioned metals.

Examples of a preferable metal oxide include: oxides of titanium, tin, zinc, iron, tungsten, zirconium, hafnium, strontium, indium, cerium, yttrium, lanthanum, vanadium, niobium or tantalum. Examples of a compound which can be incorporated in the oxide electrode include: sulfides of cadmium, zinc, silver, antimony and bismuth; selenides of cadmium and lead; a telluride of cadmium; phosphides of zinc, gallium, indium and cadmium; selenides of gallium-arsenic and copper-indium; and a sulfide of copper-indium and a nitride of titanium.

Specific examples of the abovementioned compound include: $TiO_2$, $SnO_2$, $Fe_2O_3$, $WO_3$, $ZnO$, $Nb_2O_5$, $CdS$, $ZnS$, $PbS$, $Bi_2S_3$, $CdSe$, $CdTe$, $GaP$, $InP$, $GaAs$, $CuInS_2$, $CuInSe_2$ and $Ti_3N_4$. Of these, preferably utilized are $TiO_2$, $ZnO$, $SnO_2$, $Fe_2O_3$, $WO_3$, $Nb_2O_5$, $CdS$ and $PbS$; more preferably utilized are $TiO_2$ and $Nb_2O_5$; and most preferably utilized is $TiO_2$.

In the oxide semiconductor electrode of the present invention, the above-described plural semiconductors may be utilized in combination. For example, a few types of the above described metal oxides or metal sulfides may be utilized in combination, or utilized may be a titanium oxide semiconductor mixed with 20 weight % of titanium nitride ($Ti_3N_4$). Further, zinc oxide/tin oxide complex, described in J. Chem. Soc., Chem. Commun., 15 (1999), may also be utilized. In the case when a component other than a metal oxide and a metal sulfide is added in the semiconductor, the weight ratio of the additional component to a metal oxide or a metal sulfide semiconductor is preferably not more than 30%.

<Sensitization Treatment>

The above-described oxide semiconductor is subjected to a sensitization treatment by a dye represented by aforesaid Formula (1) to prepare a photoelectric conversion element of the present invention exhibiting excellent photoelectric conversion efficiency and durability, which is an object of the present invention.

In the following, the dye represented by aforesaid Formula (1) of the present invention (hereinafter, also simply referred to as dye) will be explained.

In Formula (1), $R_1$ is an alkyl group, an aralkyl group, an alkenyl group, an aryl group or an aromatic heterocyclic group; $R_2$ is a divalent group containing an aromatic hydrocarbon ring, a divalent group containing an aromatic heterocycle or a divalent group containing an aromatic hydrocarbon ring and an aromatic heterocycle; $R_3$ is a hydrogen atom, an alkyl group, an aralkyl group, an alkenyl group, an aryl group or an aromatic heterocyclic group; $R_4$ is an aryl group; and $R_5$ is a substituent. n1 is 0 or 1; n2 and n3 each are 1 or 2; and n1+n2+n3=3. n4 is an integer of not less than 0, and n5 is an integer of 0-4. Herein, the upper limit of n4 is 10.

Examples of a substituent represented by $R_5$ include: an alkyl group, an aralkyl group, an alkoxy group, a halogen atom, an alkenyl group, an aryl group and an aromatic heterocyclic group. Each of an aryl group and an aromatic heterocyclic group represented by $R_1$ and $R_3$; an aromatic hydrocarbon ring, a heterocycle and an aromatic hydrocarbon ring-aromatic heterocycle in $R_2$; and an aryl group represented by $R_4$ may have a substituent, and as the substituent, the above mentioned substituents described for $R_5$ can be cited.

In Formula (1), A represents a chain structure containing an electron withdrawing group and an acid group, in which $R_2$ is π-conjugated with the acid group, or A represents a group represented by $A_2$ shown above. In $A_2$, B is a group of atoms necessary to form a single ring which may have a substituent. The substituent includes, for example, a halogen atom, a cyano group, a carbonyl group, a thiocarbonyl group, a selenocarbonyl group and an alkyl group. However, said monocyclic ring is not condensed with another rings or is not substituted with another rings. X is a group having an acid group.

Specific examples of an acid group include a carboxylic acid group (—COOH), phosphorous acid group (—PO(OH)$_2$) and sulfonic acid group (—SO$_2$OH). The acid group portion may also be a metal salt or an organic cationic salt. Further, a group having an acid group represented by X specifically includes -alkylene-COOH, -arylene-COOH, -alkylene-PO(OH)$_2$ and =C(CN)COOH.

An electron withdrawing group is preferably a substituent having a Hammett's substitution constant up value of not less than 0.01, and more preferably of not less than 0.1. With respect to a Hammett's substitution constant, such as Journal of Medicinal Chemistry, 1973, Vol. 16, No. 11, pp. 1207-1216 can be referred to.

An electron withdrawing group includes, for example, a halogen atom (fluorine atom (σp value: 0.06), chlorine atom (σp value: 0.23), bromine atom (σp value: 0.23), iodine atom (σp value: 0.18)), a trihalomethyl group (tribromomethyl (σp value: 0.29), trichloromethyl (σp value: 0.33), trifluoromethyl (σp value: 0.54)), a cyano group (σp value: 0.66), a nitro group (σp value: 0.78), aliphatic-aryl or heterocyclic sulfonyl group (such as methanesulfonyl group (σp value: 0.72)), aliphatic-aryl or heterocyclic acyl group (such as acetyl (σp value: 0.50) and benzoyl (σp value: 0.43)), aliphatic-aryl or heterocyclic oxycarbonyl group (such as methoxycarbonyl (σp value: 0.45) and phenoxycarbonyl (σp value: 0.45)), a carbamoyl group (σp value: 0.36) and a sulfamoyl group (σp value: 0.57).

Specific examples of $R_1$ and $R_3$ are shown below.

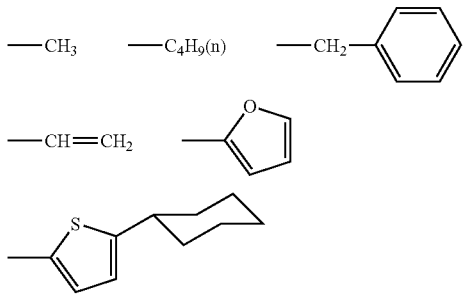

Specific examples of $R_2$ are shown below.

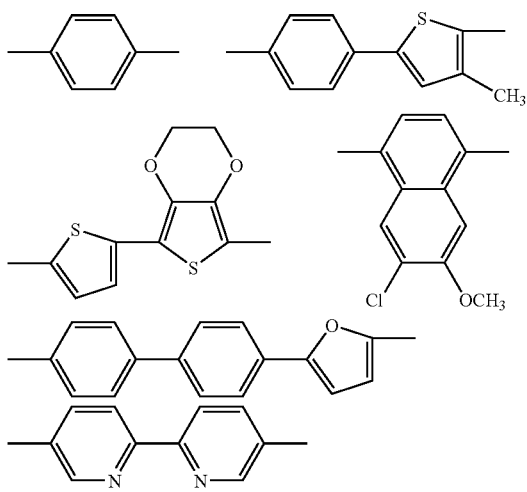

Specific examples of $R_4$ are shown below.

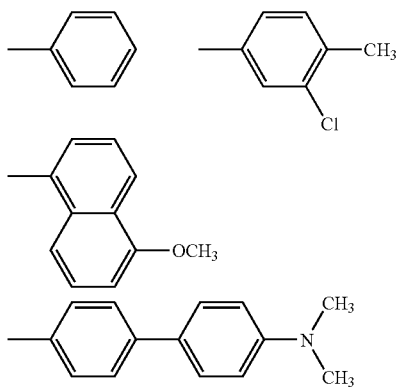

Specific examples of $R_5$ are shown below.

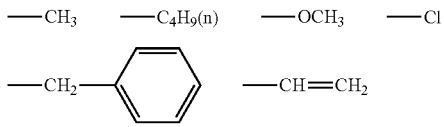

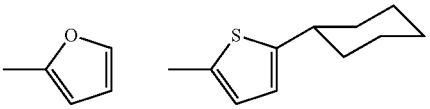

Specific examples of a chain structure containing, an electron withdrawing group and an acid group and forms a □ conjugation system between $R_2$ and the acid group, will be shown in the following.

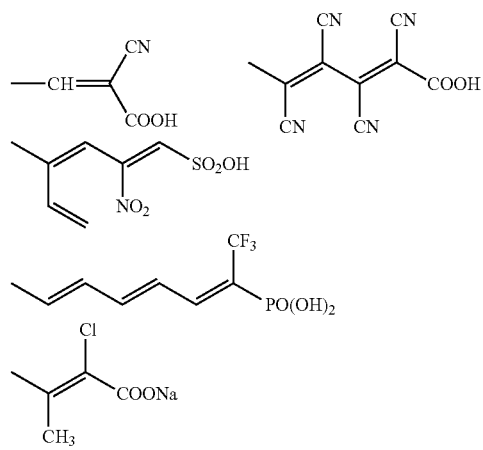

Further, specific examples of $A_2$ will be shown below.

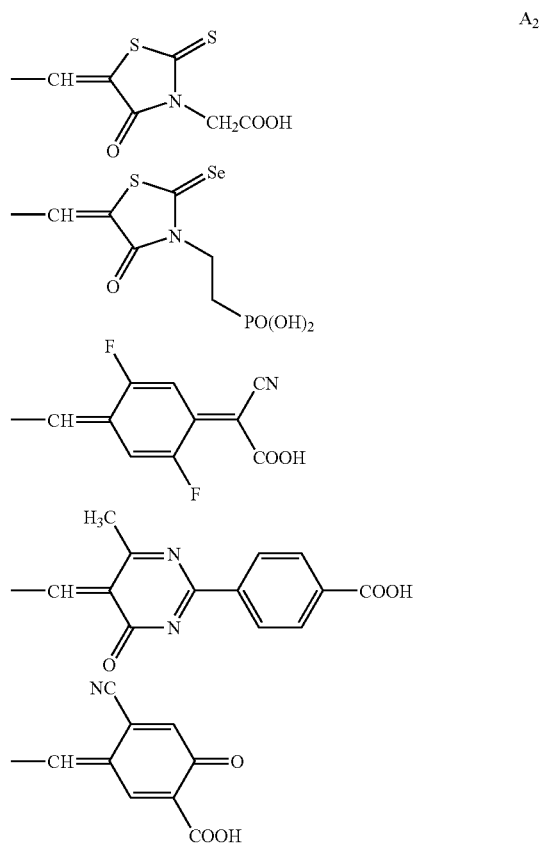

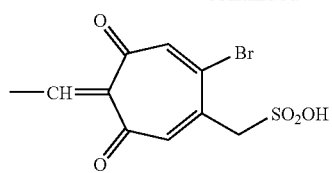
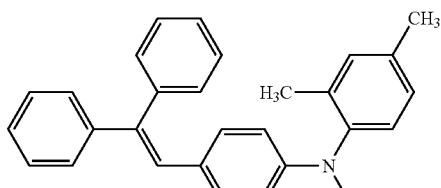
Dye (3)
In the following, specific examples of a dye represented by Formula (1) of the present invention will be shown, however, the present invention is not limited thereto.
Dye (4)
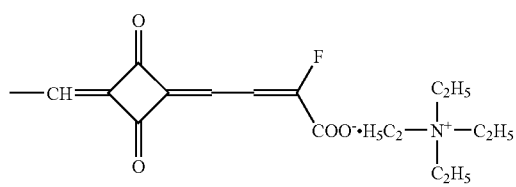
Dye (1)
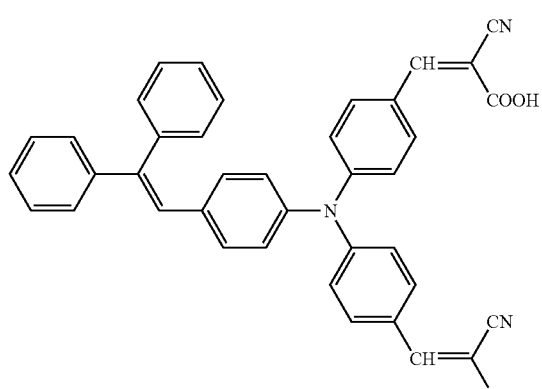
Dye (2)
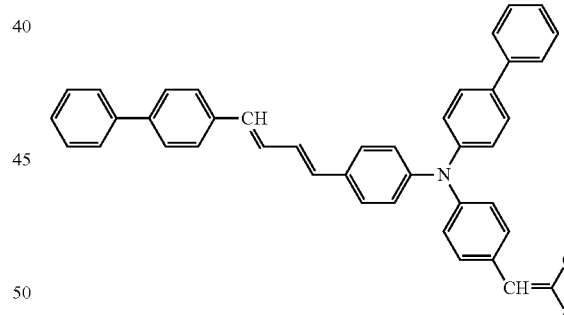
Dye (5)
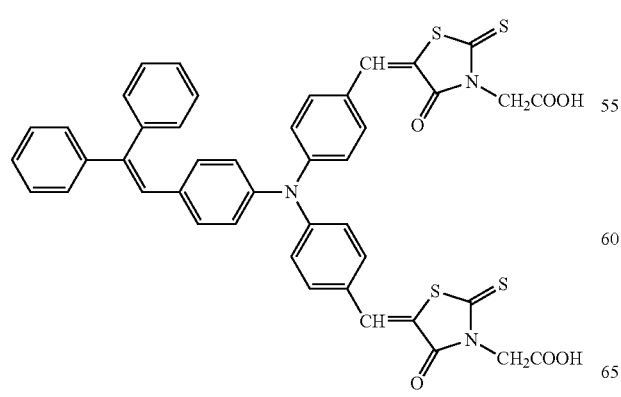
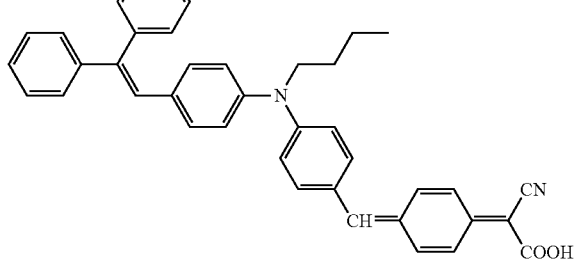
Dye (6)

-continued

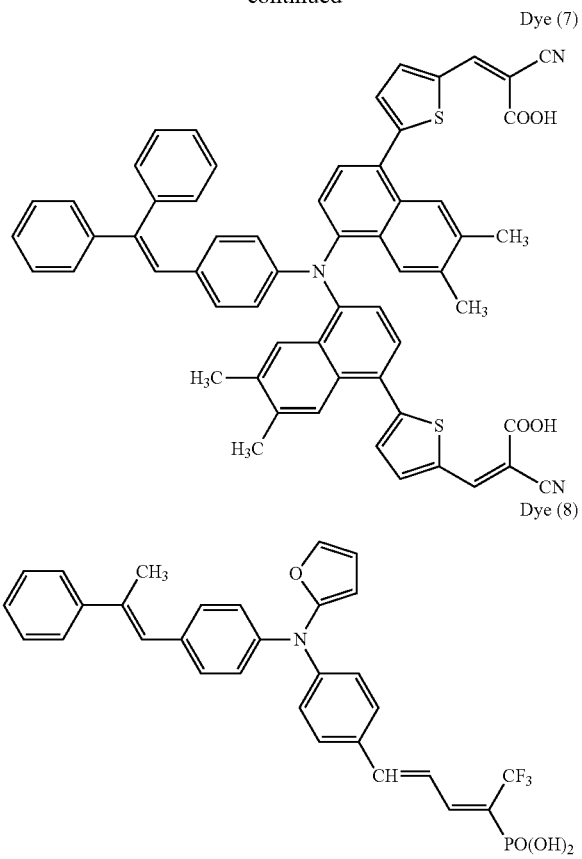

In the following, a specific synthesis method of the dye represented by Formula (1) of the present invention will be shown, however, other dye can be synthesized in a similar manner and the synthesis method is not limited thereto.

Synthesis of Dye (1)

4-(2,2-diphenylvinyl)-triphenylamine was added with 6 equivalents of phosphorus oxychloride and 8 equivalents of N,N'-dimethylformamide, and diformylation was carried out by heating at 90° C. for 16 hours under a nitrogen atmosphere. An acetic acid solution containing a diformyl substance, 2 equivalents of cyanoacetic acid and 2.2 equivalents of ammonium acetate was refluxed with heating for 1 hour, whereby dye (1) has been prepared.

Synthesis of Dye (2)

Dye (2) has been synthesized in a similar manner to synthesis of dye (1) except that rhodanin-N-acetic acid was utilized instead of cyanoacetic acid.

An oxide semiconductor of the present invention is sensitized by incorporating a dye represented by aforesaid Formula (1) and enables to exhibit the effects described in the present invention. Incorporate said dye in the oxide electrode includes various embodiments such as adsorption on the semiconductor surface, and getting the aforesaid dye into a porous structure when a semiconductor is provided with a porous structure.

Further, the total content of each dye represented by aforesaid Formula (1) per 1 m$^2$ of a semiconductor is preferably in a range of 0.01-100 mmol, more preferably 0.1-50 mmol and specifically preferably 0.5-20 mmol.

In the case of performing a sensitization treatment by use of the dye represented by aforesaid Formula (1) of the present invention, the aforesaid dye may be utilized alone; or a plurality of dyes may be utilized in combination. Further, a dye represented by aforesaid Formula (1) of the present invention and other dye (for example, dye described in such as U.S. Pat. Nos. 4,684,537, 4,927,721, 5,084,365, 5,350,644, 5,463,057 and 5,525,440; and JP-A Nos. 7-249790 and 2000-150007) may be utilized in combination.

In particular, in the case that application of the photoelectric conversion element of the present invention is a solar cell, which will be described below, it is preferable to utilize at least two kinds of dyes in combination so as to make a wavelength region of photoelectric conversion as broad as possible to effectively utilize sunlight.

To incorporate a dye represented by Formula (1) in an oxide semiconductor, an ordinary method is to dissolve the aforesaid dye in a suitable solvent (such as ethanol) and to immerse a semiconductor having been well dried in said solution for a long time.

In the case of performing a sensitization treatment utilizing a plurality of dyes represented by aforesaid Formula (1) together or said dye with another sensitizing dye in combination, it can be performed by preparing a mixed solution of each dye, or by preparing a solution of each dye and successively immersing semiconductor in each solution. In the case of manufacturing by preparation of a separate solution of each dye and successive immersion in each solution, the effects of the present invention can be obtained despite of the order of incorporation of such as the aforesaid dye or other sensitizing dye in an oxide semiconductor. Further, it is also possible, for example, to mix plural kinds of semiconductor particles, each kind containing only one of the above described dyes to prepare the oxide semiconductor electrode.

The adsorption treatment may be performed when an oxide semiconductor is in a particle state or after the particles have been formed in to a film. The solution of the dye employed for the adsorption treatment may be utilized at an ambient temperature or may be utilized by heating within the temperature range where the dye does not decompose nor the solution does not boil. Further, as the later mentioned manufacturing process of a photoelectric conversion element, adsorption of the dye may be carried out after the application of semiconductor particles. Further, adsorption of the dye may be carried out by simultaneously applying the semiconductor particles and the dye of the present invention. The dye not adsorbed by the semiconductor can be removed by washing.

As for a sensitization treatment of the oxide semiconductor of the present invention, a sensitization treatment is carried out by incorporation of a dye represented by aforesaid Formula (1), however, details of a sensitization treatment will be specifically explained in an explanation of a photoelectric conversion element which will be described later.

In the case of an oxide semiconductor having a semiconductor thin film having a high porosity, it is preferable to complete an adsorption treatment of such as the aforesaid dye or other sensitizing dye (a sensitization treatment of an oxide semiconductor) before the water or water vapor adsorbs on semiconductor film and voids of the interior of semiconductor thin film.

An oxide semiconductor of the present invention may be subjected to a surface treatment by use of an organic base. The aforesaid organic base includes, for example, diarylamine, triarylamine, pyridine, 4-t-butylpyridine, polyvinyl pyridine, quinoline, piperidine and amidine, however, preferable among them are pyridine, 4-t-butylpyridine and polyvinyl pyridine.

The surface treatment can be carried out by using the aforesaid organic base as it is when it is a liquid, or by preparing a solution of an organic base dissolved in an organic solvent when it is a solid, and by immersing an oxide semiconductor of the present invention in liquid amine or in an amine solution.

As the dye usable together with the dye represented by aforesaid Formula (1), any dye can be utilized as far as being capable of spectral sensitization of the oxide semiconductor of the present invention. It is preferable to mix at least two different dyes to make a wavelength region of photoelectric conversion as broad as possible and to increase conversion efficiency. Further, the types of dyes to be mixed and the mixing ratio thereof can be selected to match the wavelength range and the strength distribution of aimed light source.

Among the dyes utilized together, preferably employed are a metal complex dye, a phthalocyanine dye, a porphyrin dye and a polymethine dye from a comprehensive viewpoints of the activity for a photoelectron transfer reaction, durability against light and photochemical stability

[Photoelectric Conversion Element]

The photoelectric conversion element of the present invention is constituted by arranging an oxide semiconductor electrode, which is comprised of an electrically conductive support having thereon an oxide semiconductor adsorbed with a dye, and a counter electrode facing the oxide semiconductor electrode through a charge transfer layer. In the following, an oxide semiconductor electrode, a charge transfer layer and a counter electrode will be explained.

<Oxide Semiconductor Electrode>

A preparation method of an oxide semiconductor electrode of the present invention will now be explained.

An embodiment of an oxide semiconductor electrode of the present invention includes a method to form the above-described oxide semiconductor on a conductive support by calcination.

In the case of preparing an oxide semiconductor of the present invention by calcination, a sensitizing treatment of said semiconductor utilizing the above-described dye and other sensitizing dye (such as adsorption and getting into a porous substance) is preferably performed after calcination. After calcination, it is preferable to quickly perform an adsorption treatment of dye before water adsorbs on a semiconductor.

In the case of the oxide semiconductor of the present invention being particles, an oxide semiconductor electrode is preferably prepared by coating or spraying an oxide semiconductor on a conductive support. Further, when the oxide semiconductor of the present invention is a film which is not held on a conductive support, the oxide semiconductor electrode film is preferably pasted on a conductive support to prepare an oxide semiconductor electrode.

(Electrically Conductive Support)

As an electrically conductive support (also referred to as merely a conductive support) utilized for the photoelectric conversion element of the present invention and the solar cell of the present invention, utilized are those having a structure comprising a conductive substance arranged on a non-conductive material such as a glass plate or a plastic film. Examples of a material utilized for a conductive support include a metal (such as platinum, gold, silver, copper, aluminum, rhodium and indium), a conductive metal oxide (such as an indium-tin complexing oxide and tin oxide doped with fluorine) or carbon. Thickness of a conductive support is not specifically limited, however, is preferably 0.3-5 mm.

The conductive support is preferably substantially transparent. To be essentially transparent means to have a transmittance of not less than 10%, more preferably of not less than 50% and most preferably of not less than 80%. To obtain a transparent support, it is preferable to provide a conductive layer comprising a conductive metal oxide on the surface of a glass plate or a plastic film. In the case of utilizing a transparent conductive support, light is preferably incident from the support side.

Surface resistance of a conductive support is preferably not more than 5 Ω/sq and more preferably not more than 10 Ω/sq.

(Preparation of Coating Liquid Containing Oxide Semiconductor Particles)

First a coating liquid containing fine powder of an oxide semiconductor is prepared. The primary particle diameter of this semiconductor fine powder is preferably smaller; the primary particle diameter is preferably 1-5,000 nm and more preferably 2-50 nm. A coating liquid containing semiconductor fine powder can be prepared by dispersing semiconductor fine powder in a solvent. Semiconductor fine powder dispersed in a solvent is dispersed in a state of the primary particle. Any solvent is usable as far as it can disperse the fine powder and the solvent is not specifically limited.

The aforesaid solvent includes, for example, water, an organic solvent and a mixed solution of water and an organic solvent. As an organic solvent, an alcohol such as methanol or ethanol; a ketone such as methyl ethyl ketone, acetone or acetyl acetone; and a hydrocarbon such as hexane or cyclohexane are usable. In a coating liquid, a surfactant or a viscosity controlling agent (such as a polyalcohol such as polyethylene glycol) can be appropriately incorporated. A range of concentration of a semiconductor fine powder in a solvent is preferably 0.1-70% by weight and more preferably 0.1-30% by weight.

(Application of Coating Liquid Containing Semiconductor Fine Powder and Calcination Treatment of Formed Semiconductor Layer)

A coating liquid containing semiconductor fine powder prepared in the above manner is coated or sprayed on a conductive support, followed by being dried, and is calcinated in air or in an inert gas, whereby a semiconductor layer (semiconductor film) is formed on a conductive support.

The film prepared by coating and drying the coating liquid on a conductive support is comprised of aggregate of semiconductor particles, and the particle diameter of the particles corresponds to the primary particle diameter of utilized semiconductor fine powder.

Since semiconductor particle aggregate film formed on a substrate of such as a conductive support in this manner is weak in bonding strength with a conductive support or in bonding strength among particles each other as well as in mechanical strength, the calcination treatment of the aforesaid semiconductor particle aggregate film is preferably performed to increase mechanical strength and to make calcinated film firmly adhered on a substrate.

In the present invention, the calcinated film may have any structure, however, preferable is a film having a porous structure (having voids, also referred to as a porous layer).

The porosity of the semiconductor film of the present invention is preferably not more than 10% by volume, more preferably not more than 8% by volume and specifically preferably 0.01-5% by volume. A porosity of a semiconductor film means a porosity penetrating in the thickness direction of a dielectric substance, and can be measured by use of an apparatus available on the market such as a mercury porosimeter (Shimazu Porelyzer 9220).

The layer thickness of the semiconductor layer containing a calcinated substance film having a porous structure is preferably at least not less than 10 nm and more preferably 100-10,000 nm.

At the time of a calcination treatment, the calcination temperature is preferably not higher than 1,000° C., more preferably 200-800° C. and specifically preferably 300-800° C., in order to suitably control the actual surface area of the calcinated film and to prepare the calcinated film having the above-described porosity.

The ratio of an actual surface area to an apparent surface area can be controlled by, for example, the particle diameter of semiconductor particles and the calcination temperature. After the calcination treatment, for the purpose of increasing a surface area, and increasing the purity of titanium oxide in the vicinity of semiconductor particles in order to increase electron injection efficiency from dye to semiconductor particles, a chemical plating treatment may be performed utilizing a titanium tetrachloride aqueous solution or an electrochemical plating treatment may be performed utilizing a titanium trichloride aqueous solution.

(Sensitization Treatment of Oxide Semiconductor)

A sensitization treatment of the oxide semiconductor is performed by dissolving dye in a suitable solvent and immersing a substrate, comprising the aforesaid semiconductor having been calcinated, in the solution. At this time, the substrate formed by calcinating a semiconductor layer (also referred to as semiconductor film) is preferably subjected to a evacuation treatment or a heating treatment to eliminate air bubbles in the film so that the dye represented by aforesaid Formula (1) can deeply enter into the interior of a semiconductor layer (semiconductor film). Accordingly, it is specifically preferable when the semiconductor layer (semiconductor film) is a porous film.

A solvent utilized to dissolve dye represented by aforesaid Formula (1) is not specifically limited as far as it dissolves said dye and does not dissolve nor react with the semiconductor. However, it is preferable that the solvent is degassed and purified by distillation in advance to prevent moisture and air dissolved in the solvent from entering into semiconductor film resulting in prevention of a sensitization treatment such as by adsorption of the aforesaid dye.

For dissolution of the aforesaid dye, examples of a preferably utilized solvent include: alcohol solvents such as methanol, ethanol and n-propanol; ketone solvents such as acetone and methylethyl ketone; ether solvents such as diethyl ether, diisopropyl ether, tetrahydrofuran and 1,4-dioxane; and a hydrocarbon halogenide solvent such as methylene chloride and 1,1,2-trichloroethane. Of these, specifically preferable are methanol, ethanol, acetone, methylethyl ketone, tetrahydrofuran and methylene chloride.

(Temperature and Duration of Sensitization Treatment)

In order to sufficiently promote the adsorption of the aforesaid dye by deeply penetrating into a semiconductor layer (semiconductor film) to sufficiently sensitize the semiconductor, and also to avoid the disturbance of the adsorption of the dye due to the decomposition product of the dye in the solution, the duration to immerse a substrate containing a calcinated oxide semiconductor in a solution containing a dye represented by aforesaid Formula (1) is preferably 3-48 hours and more preferably 4-24 hours, under a condition of 25° C. This effect is particularly significant when a semiconductor film is a porous film. The above duration of immersion is a value under a condition of 25° C. and it is not the case when the temperature condition is varied.

In the case of immersion, a solution containing the dye represented by aforesaid Formula (1) may be used by heating the solution within a temperature range where it does not boil, provided that the dye does not decomposes. A preferable temperature range is 10-100° C. and more preferably 25-80° C.; however, it is not the case when a solvent boils in the aforesaid temperature range, as described above.

<Charge Transfer Layer>

The charge transfer layer utilized in the present invention will now be explained.

In a charge transfer layer a redox electrolyte is preferably utilized. A redox electrolyte includes, for example, a $I^-/I_3^-$ type, a $Br^-/Br_3^-$ type and a quinone/hydroquinone type. These redox electrolytes can be prepared by a method conventionally well known in the art, and for example, an electrolyte of $I^-/I_3^-$ type can be prepared by mixing iodine and an ammonium salt of iodine. A charge transfer layer is constituted of a dispersion of these redox electrolytes. The dispersion is referred to as (i) a liquid electrolyte when it is a liquid, (ii) a solid polymer electrolyte when an electrolyte is dispersed in polymer which is solid at ordinary temperature, and (iii) a gel electrolyte when an electrolyte is dispersed in a gel form substance. In the case that a liquid electrolyte is utilized as a charge transfer layer, an electrochemically inert solvent is used, of which examples include: acetonitrile, propylene carbonate and ethylene carbonate. Examples of a solid electrolyte are disclosed in JP-A 2001-160427, and examples of a gel electrolyte are shown in "Surface Science", vol. 21, No. 5, pp. 288-293.

<Counter Electrode>

The counter electrode utilized in the present invention will now be explained.

As a counter electrode, those having conductivity are applicable and any conductive material is usable, however, preferable is a material having a catalytic function to promote the oxidation reaction of such as $I_3$— ions and the reduction reaction of other redox ions to carry out at a sufficient rate. Examples of such a material include: a platinum electrode, a conductive material having a plated or evaporated platinum layer on the surface, rhodium metal, ruthenium metal, ruthenium oxide and carbon.

[Solar Cell]

The solar cell of the present invention will now be explained.

In the solar cell of the present invention, optimization of the design and the circuit design against sunlight are carried out, as an embodiment of a photoelectric conversion element of the present invention, to provide a structure by which optimum photoelectric conversion is obtained when sunlight is utilized as a light source. That is, a structure in which a dye sensitized oxide semiconductor is capable of being irradiated with sunlight. At the time of fabricating a solar cell of the present invention, it is preferable that the aforesaid oxide semiconductor, charge transfer layer and counter electrode are stored in a sealed case or the whole members are sealed with resin.

When the solar cell of the present invention is irradiated with sunlight or electromagnetic waves equivalent to sunlight, the dye adsorbed on an oxide semiconductor absorbs irradiated sunlight or electromagnetic waves to be excited. An electron generated by the excitation is transferred to the semiconductor and successively to the conductive support. Then the electron is transferred through an external circuit to the counter electrode where the electron reduces the redox electrolyte in the charge transfer layer. On the other hand, the dye of the present invention, which has given the electron to the semiconductor, is in an oxidized state, however, returns to the original reduced state by receiving an electron from the counter electrode via the redox electrolyte in a charge transfer layer. Simultaneously, the redox electrolyte in a charge transfer layer returns again to an oxidized state capable of being reduced with an electron supplied from the counter electrode.

The electrons flows in this manner, and the solar cell utilizing the photoelectric conversion element of the present invention can be thus constituted.

EXAMPLES

In the following, the present invention will be explained referring to examples, however the present invention is not limited thereto.

Example 1

Preparation of Photoelectric Conversion Element 1

Titanium oxide paste (a particle diameter of 18 nm) available on the market was applied on a glass substrate provided with a fluorine-doped tin oxide (FTO) conductive layer (a FTO coated glass substrate) by a doctor blade method. The paste, after having been dried by heating at 60° C. for 10 minutes, was subjected to a calcination treatment at 500° C. for 30 minutes, whereby a titanium oxide thin film having a thickness of 5 μm was prepared.

Dye (1) was dissolved in ethanol to prepare a solution of $3 \times 10^{-4}$ M (mole/liter). The FTO coated glass substrate on which titanium oxide had been applied and calcinated was immersed in the above solution for 16 hours at room temperature to perform an adsorption treatment of the dye, whereby an oxide semiconductor electrode was prepared.

As a charge transfer layer (a liquid electrolyte), a 3-methylpropionyltrile solution containing 0.4 M of lithium iodide, 0.05 M of iodine and 0.5 M of 4-(t-butyl)pyridine was utilized. A platinum plate was utilized as a counter electrode, and photoelectric conversion element 1 was prepared by assembling together with an oxide semiconductor electrode and a liquid electrolyte, which had been prepared in advance, by use of a cramp cell.

[Preparation of Photoelectric Conversion Elements 2-10]

Photoelectric conversion elements 2-10 were prepared in a similar manner to preparation of Photoelectric conversion element 1 except that dyes (2)-(8), a comparative dye and a Ru complex (dithiocyanato-bis(2,2'-pyridyl-4,4'-dicarboxylato) ruthenium) each were utilized as shown in Tables 1 and 2 instead of dye (1).

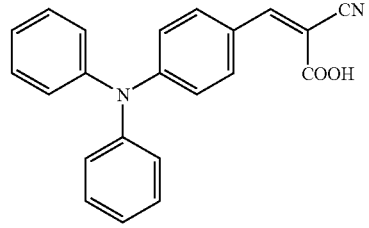

Comparative Dye

[Evaluation]

Under irradiation of a xenon lamp at an intensity of 100 mW/cm², photoelectric conversion characteristics were measured under a condition of covering an oxide semiconductor electrode with a mask of 5×5 mm².

That is, with respect to photoelectric conversion elements 1-10, a current-voltage characteristic at room temperature was measured by use of an I-V tester, whereby a short circuit current (Jsc), an open circuit voltage (Voc) and a filling factor (F. F.) were determined, and photoelectric conversion efficiency (η(%)) was determined from them. The photoelectric conversion efficiency (η(%)) of a photoelectric conversion element was calculated based on following Equation (A).

$$\eta = 100 \times (Voc \times Jsc \times F.F.)/P \quad \text{Equation (A)}$$

wherein, P is an incident light intensity [mW/cm²], Voc is an open circuit voltage [V], Jsc is a short circuit current density [mA/cm²] and F. F. is a filling factor.

Further, after an oxide semiconductor electrode had been exposed to an ozone atmosphere of 9 ppm for 20 minutes, variation of the photoelectric conversion characteristics was observed.

Table 1 shows the results of the characteristics evaluation of the photoelectric conversion elements before ozone exposure, and Table 2 shows the results of the characteristics evaluation of the photoelectric conversion elements after ozone exposure. Further, in Table 2, ratios of the photoelectric efficiencies before and after ozone exposure are shown. The ratio of the photoelectric conversion efficiencies before and after ozone exposure is given by the following equation:

(Ratio of conversion efficiency before and after ozone exposure)=(Photoelectric conversion efficiency after ozone exposure)/(Photoelectric conversion efficiency before ozone exposure)

wherein "Ratio of conversion efficiency" represent the ratio of the photoelectric conversion efficiencies.

TABLE 1

| Photoelectric conversion element | Dye | Open circuit voltage (V) | Short circuit current (mA·cm⁻²) | Filling factor | Conversion efficiency (%) | Remarks |
| --- | --- | --- | --- | --- | --- | --- |
| 1 | (1) | 0.76 | 5.6 | 0.54 | 2.3 | Invention |
| 2 | (2) | 0.64 | 2.0 | 0.60 | 0.8 | Invention |
| 3 | (3) | 0.74 | 5.6 | 0.56 | 2.4 | Invention |
| 4 | (4) | 0.71 | 5.9 | 0.58 | 2.4 | Invention |
| 5 | (5) | 0.73 | 4.7 | 0.55 | 1.9 | Invention |
| 6 | (6) | 0.68 | 3.8 | 0.61 | 1.6 | Invention |
| 7 | (7) | 0.68 | 6.3 | 0.54 | 2.3 | Invention |
| 8 | (8) | 0.70 | 4.4 | 0.56 | 1.7 | Invention |
| 9 | Comparative dye | 0.68 | 3.9 | 0.52 | 1.4 | Comparison |
| 10 | Ru complex | 0.77 | 6.0 | 0.52 | 2.4 | Comparison |

TABLE 2

| Photoelectric conversion element | Dye | Open circuit voltage (V) | Short circuit current (mA · cm$^{-2}$) | Filling factor | Conversion efficiency (%) | Ratio of conversion efficiency before and after ozone exposure | Remarks |
|---|---|---|---|---|---|---|---|
| 1 | (1) | 0.59 | 2.8 | 0.57 | 0.95 | 0.41 | Invention |
| 2 | (2) | 0.47 | 1.1 | 0.59 | 0.31 | 0.40 | Invention |
| 3 | (3) | 0.59 | 2.3 | 0.58 | 0.80 | 0.34 | Invention |
| 4 | (4) | 0.61 | 3.0 | 0.56 | 1.02 | 0.43 | Invention |
| 5 | (5) | 0.57 | 2.1 | 0.60 | 0.72 | 0.38 | Invention |
| 6 | (6) | 0.55 | 1.9 | 0.57 | 0.59 | 0.37 | Invention |
| 7 | (7) | 0.60 | 2.2 | 0.61 | 0.81 | 0.35 | Invention |
| 8 | (8) | 0.58 | 2.0 | 0.59 | 0.68 | 0.40 | Invention |
| 9 | Comparative dye | 0.51 | 1.4 | 0.61 | 0.42 | 0.31 | Comparison |
| 10 | Ru complex | 0.28 | 0.22 | 0.42 | 0.03 | 0.01 | Comparison |

From the ratios of the photoelectric conversion efficiencies between and after the ozone exposure shown in Tables 1 and 2, it is clear that any of triphenyamine dyes (1)-(8) and comparative dye has anti-oxidation durability significantly superior than that of the Ru complex. In particular, it is clear that dyes (1)-(8) of the present invention, which have a styryl structure, exhibited higher anti-oxidation durability compared to the comparative dye without a styryl structure, and that introduction of a styryl structure into triphenylamine central moiety is effective as a guide to obtain a sensitizing dye having a high durability.

What is claimed is:

1. A photoelectric conversion element comprising an electrically conductive support having thereon an oxide semiconductor electrode comprising an oxide semiconductor which is adsorbed with a dye, and a counter electrode facing the oxide semiconductor electrode through a charge transfer layer, wherein
the dye is represented by Formula (1):

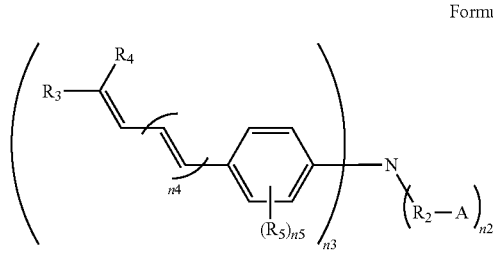

Formula (1)

wherein R$_2$ represents a phenylene group; R$_3$ represents a hydrogen atom, an alkyl group, an aralkyl group, an alkenyl group, an aryl group or an aromatic heterocyclic group; R$_4$ represents an aryl group; R$_5$ represents a substituent; n2 and n3 each are 1 or 2; n2+n3=3; n4 is an integer of not less than 0; n5 is an integer of 0-4; and A represents a chain structure containing an electron withdrawing group and an acid group, provided that R$_2$ is p-conjugated with the acid group, or A represents a group represented by A$_2$,

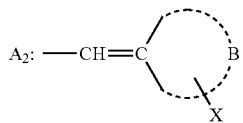

wherein B represents a group of atoms necessary to form a single ring which may have a substituent, provided that the single ring is not condensed with another ring nor substituted with another ring; and X represents a group containing an acid group.

2. A photoelectric conversion element comprising an electrically conductive support having thereon an oxide semiconductor electrode comprising an oxide semiconductor which is adsorbed with a dye, and a counter electrode facing the oxide semiconductor electrode through a charge transfer layer, wherein
the dye is represented by Formula (1):

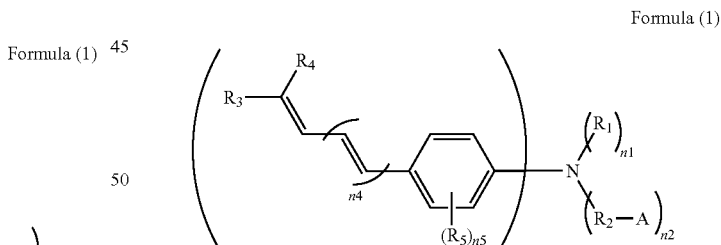

Formula (1)

wherein R$_1$ represents an alkyl group, an aralkyl group, an alkenyl group, an aryl group or an aromatic heterocyclic group; R$_2$ represents a divalent group containing an aromatic hydrocarbon ring, a divalent group containing an aromatic heterocycle or a divalent group containing an aromatic hydrocarbon ring and an aromatic heterocycle; R$_3$ represents a hydrogen atom, an alkyl group, an aralkyl group, an alkenyl group, an aryl group or an aromatic heterocyclic group; R$_4$ represents an aryl group; R$_5$ represents a substituent; n1 is 0 or 1; n2 and n3 each are 1 or 2; n1+n2+n3=3; n4 is an integer of not less than 0; n5 is an integer of 0-4; and A represents a chain structure selected from the group consisting of:

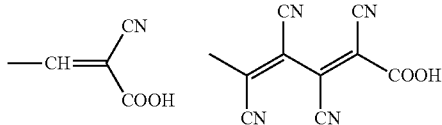

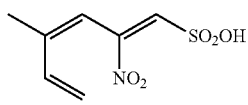

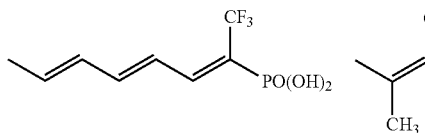

3. The photoelectric conversion element of claim 1, wherein n4 in Formula (1) is 0.

4. The photoelectric conversion element of claim 1, wherein the oxide semiconductor includes titanium oxide.

5. The photoelectric conversion element of claim 1, wherein a thickness of the oxide semiconductor electrode is 100 to 10000 nm.

6. The photoelectric conversion element of claim 1, wherein a 3-methylpropionitrile solution containing lithium iodide, iodine and 4-(t-butyl)pyridine is used in the charge transfer layer.

7. A solar cell comprising the photoelectric conversion element of claim 1.

8. A photoelectric conversion element comprising an electrically conductive support having thereon an oxide semiconductor electrode comprising an oxide semiconductor which is adsorbed with a dye, and a counter electrode facing the oxide semiconductor electrode through a charge transfer layer, wherein the dye is selected from the group consisting of Dyes (1) to (8):

Dye (1)

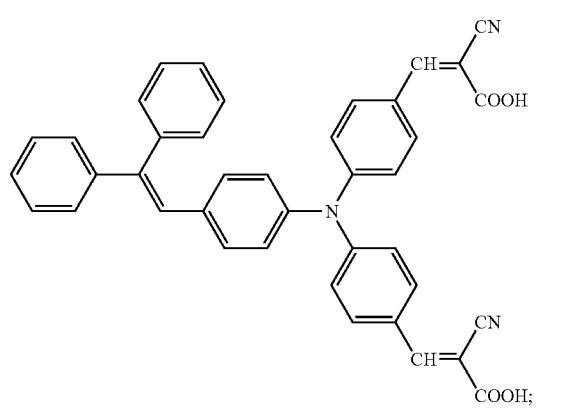

Dye (2)

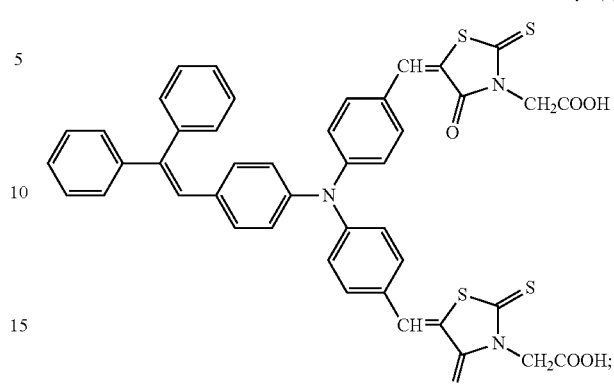

Dye (3)

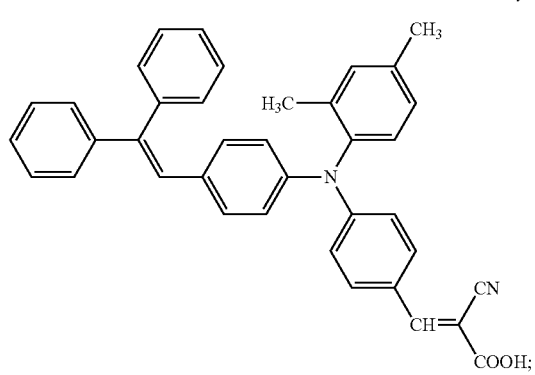

Dye (4)

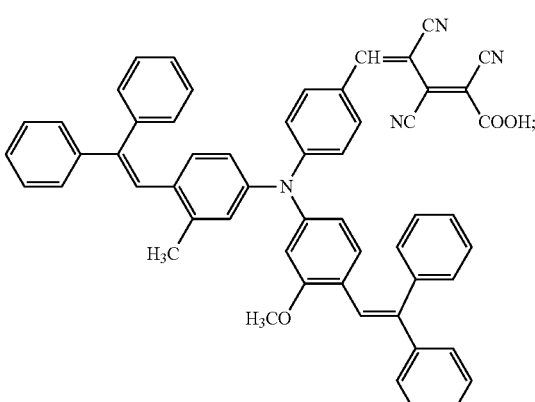

Dye (5)

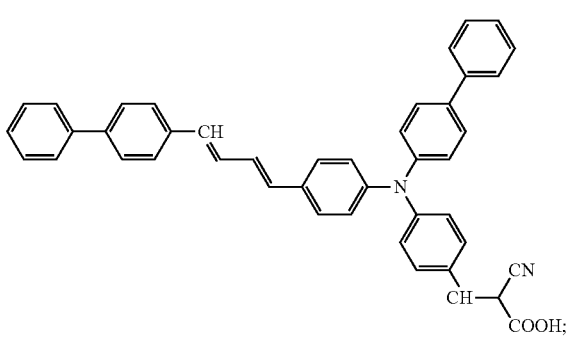

-continued
Dye (6)
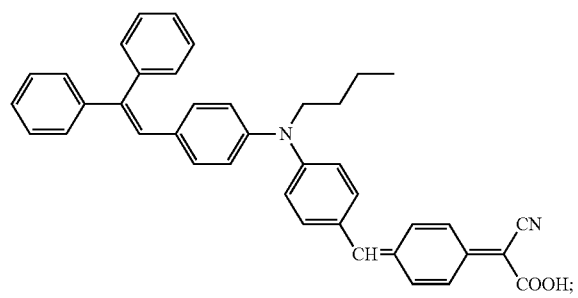
Dye (8)
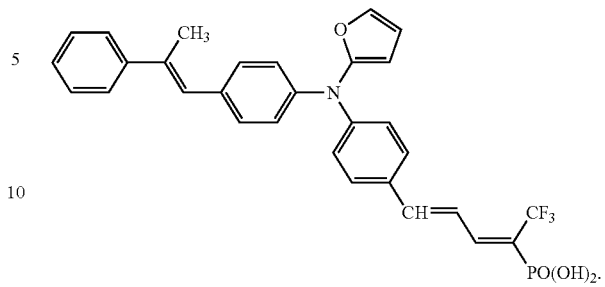
9. The photoelectric conversion element of claim 8, wherein the dye is Dye (3):
Dye (7)
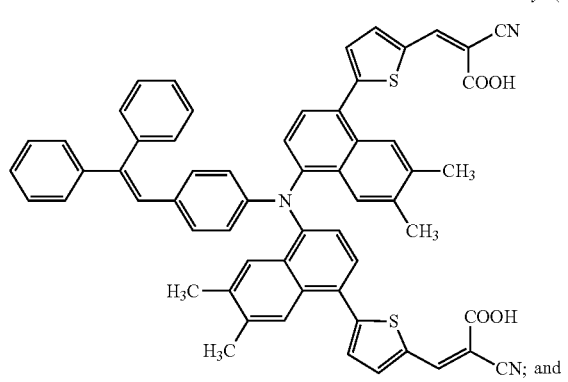
Dye (3)
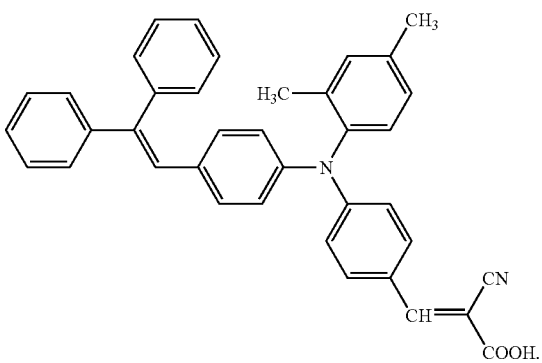
* * * * *